United States Patent [19]

Watanabe et al.

[11] Patent Number: 4,985,294
[45] Date of Patent: Jan. 15, 1991

[54] PRINTED WIRING BOARD

[75] Inventors: Hideo Watanabe, Kanagawa; Hajime Yamazaki, Hadano; Hiroyuki Wakamatsu, Kawasaki, all of Japan

[73] Assignee: The Yokohama Rubber Co., Ltd., Minato-ky, Japan

[21] Appl. No.: 397,790

[22] Filed: Aug. 24, 1989

[30] Foreign Application Priority Data

Aug. 25, 1988 [JP] Japan ................................. 63-209341
Aug. 25, 1988 [JP] Japan ................................. 63-209342

[51] Int. Cl.$^5$ ............................................. B32B 9/00
[52] U.S. Cl. .................................... 428/209; 428/413; 428/414; 428/418; 428/457; 428/463; 428/901; 361/397; 361/398
[58] Field of Search ............... 428/209, 198, 413, 414, 428/418, 457, 463, 901; 361/397, 398; 174/685

[56] References Cited

U.S. PATENT DOCUMENTS

| | | | |
|---|---|---|---|
| 4,152,477 | 5/1979 | Haruta et al. | 428/209 |
| 4,212,912 | 7/1980 | Wartusch et al. | 428/209 |
| 4,353,954 | 10/1982 | Yamaoka et al. | 428/216 |
| 4,444,848 | 4/1984 | Shanefield et al. | 428/624 |
| 4,837,086 | 6/1989 | Takahashi et al. | 428/506 |

Primary Examiner—Patrick J. Ryan
Attorney, Agent, or Firm—Finnegan, Henderson, Farabow, Garrett & Dunner

[57] ABSTRACT

Composite films for use in printed wiring boards are comprised of an insulating layer and a copper foil laminated thereover, the insulating layer being made up predominantly of a selected epoxy resin and a selected acrylonitrile-butadiene rubber, whereby voidlessness, thickness uniformity and insulation adjustment are enhanced. Also disclosed is a method of producing a printed wiring board using the film by a subtractive process.

11 Claims, 2 Drawing Sheets

PRINTED WIRING BOARD

BACKGROUND OF THE INVENTION

1. Technical Field

This invention relates to printed wiring boards and more particularly to copper-clad insulating films for use in the wiring boards and also to a method of producing such board using such film by a subtractive process.

2. Prior Art

Printed wiring boards of a multi-layered type are known which are constructed with a plurality of electrically conductive circuits laminated by an insulating layer. These wiring boards have been applied to mechanized fabrication of electronic equipment and further to various other sectors of industry.

In general, the above wiring board is assembled by mounting copper patterns on two opposite surfaces of a dielectric base or substrate to thereby form a printed circuit board and subsequently laminating a copper foil over the circuit board on both sides with layers of a glass epoxy prepreg interposed. The prepreg is derived by impregnating an epoxy resin into fibrous glass. The copper foil is etched to provide printed circuitry. The circuit board is fabricated usually by a subtractive process from a copper-clad laminate commonly accepted in the industry.

Such known mode of assembly, however, is effected necessarily under elevated temperature and pressure conditions, say at 170° C. and at 40 kg/cm², so as to remove air entrained in the prepreg. This leaves the problem that the resulting laminate product will involve residual strains resulting from the heat and pressure while in lamination, the strains leading to pattern failure in the printed circuitry.

SUMMARY OF THE INVENTION

The present invention seeks to provide a composite film for use in printed wiring boards which will eliminate the foregoing difficulties of the prior art and which will exhibit interlaminar voidlessness and thickness uniformity and permit adjustment of insulation characteristics, thus ensuring high reliability. Another object of the invention is to provide an improved method of producing a printed wiring board using such film which will allow for simple and efficient operations without involving adverse heat and pressure conditions. Still another object of the invention is to provide a novel printed wiring board having such film assembled.

The above and other objects and advantages of the invention will be better understood from the following description taken in conjunction with the accompanying drawings.

According to a first aspect of the invention, there is provided a composite film for use in printed wiring boards which comprises an insulating layer and a copper foil laminated thereover, the insulating layer comprising an epoxy resin and an acrylonitrile-butadiene rubber.

According to a second aspect of the invention, there is provided a method of producing a printed wiring board which comprises vacuum-laminating a composite film over one or both of a substrate, the film comprising an insulating layer and a copper foil laminated thereon, the insulating layer comprising an epoxy resin and an acrylonitrile-butadiene rubber, and subsequently curing the resulting laminate with heat.

According to a third aspect of the invention, there is provided a printed wiring board comprising the film of the first aspect and obtained by the method of the second aspect.

DETAILED DESCRIPTION OF THE INVENTION

Figure 1:
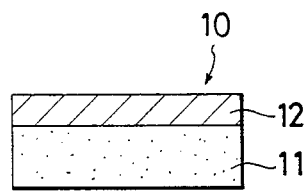
FIG. 1 is a cross-sectional view showing a composite film embodying the present invention.

A composite film for utility in printed wiring boards, provided in accordance with the present invention and shown at 10 in FIG. 1, is comprised essentially of an insulating layer 11 and a copper foil 12 disposed integrally thereover.

The insulating layer is constituted by a blend predominantly of an epoxy resin (ER) and an acrylonitrile-butadiene rubber (NBR). ER resins eligible for purposes of the invention are not specifically restrictive, but may typically be of a bisphenol-epichlorohydrin or cresol-novolak type. NBR rubbers used herein may preferably be selected from those having an acrylonitrile content in the range of 20 to 50% and a Mooney viscosity ($ML_{1+4}$ at 100° C.) in the range of 25 to 80.

The blend ratio of ER to NBR should range from 30:70 to 90:10 by weight. The insulating layer departing from the 30:70 ratio, i.e. too less ER and too much NBR, would lead to insufficient interlaminar insulation and poor fluidity in between the circuits on lamination over a given printed circuit board. Departures from the 90:10 ratio, excessive ER and lesser NBR, should also be avoided as the insulating layer would be rendered inadequately bondable on to the copper patterns on the circuit board and extremely fluid at the time of lamination. This is interpreted to mean that the insulating layer would invite objectionable resin flow during heat curing and thus result in thickness irregularity.

No restriction is imposed upon the type of copper foils used. An electrolytic copper foil with a thickness of 18 microns, ½ ounce, may suitably be employed.

The insulating layer when in lamination on the circuit board may preferably be held uncured to attain improved bondability with the copper patterns. The insulating layer uncured should have a viscosity of $10^3$ to $10^5$ poises at a maximum temperature when in lamination. Lower viscosities than $10^3$ poises would make the insulating layer susceptible to excessive fluidity and hence irregular thickness. In the case of higher viscosities than $10^5$ poises, such layer would fail to fully flow in between the circuits.

To facilitate handling, the composite film of the invention may be provided on one side opposed to the copper foil with a release film where the insulating layer is uncured. Suitable release films include for example releasable materials such as silicone-treated polyethyleneterephthalate films (PET), silicone-treated polyester films, release papers, metal foils treated with a wax or similar agent and including aluminum foils and the like. The release film is removed eventually on attachment of the composite film to the circuit board.

When the uncured insulating layer is used, a cured resinous layer not shown may be interposed between the insulating layer and the copper foil so that insulation is further improved against the latter foil. The resinous layer may be formed of the same material and composition as is in the insulating layer. Other suitable materials include for example epoxy resins, acrylic resins, polyimide resins and the like.

Figure 2:
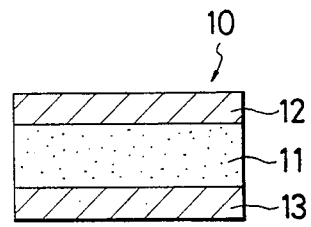
FIG. 2 is a view similar to FIG. 1 but illustrative of a modification of the film.

The insulating layer according to the invention may be cured, and in such instance the cured layer is bonded on to the circuit board by a suitable adhesive agent. Alternatively, a bonding layer may be disposed over the cured insulating layer, as seen at 13 from FIG. 2, by the use of an adhesive and protected with either one of the above specified release films. Epoxy type adhesives are suitably used in this modified form. The bonding layer should range in viscosity from $10^3$ to $10^5$ poises at a maximum temperature at the time of lamination as does the uncured insulating layer.

The film structure according to the invention enables interlaminar insulation to be easily adjusted at will by changing the thickness of the insulating layer.

Figure 5:
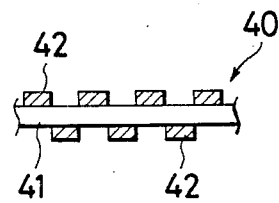
FIGS. 5 and 6 are cross-sectional views showing the manner in which a printed wiring board of the prior art is assembled by a subtractive process.

A printed wiring board according to the invention may be produced by laminating the composite film 10 over a known printed circuit board shown at 40 in FIG. 5 and built with a substrate 41 and copper patterns 42 mounted on both sides of the substrate. Importantly, this lamination should be effected as on a vacuum laminator at a reduced pressure of several to tens of torrs, whereby a laminate product is obtained without interlaminar voids involved.

In another preferred embodiment of the invention, the insulating layer 11 and the copper foil 12 may be separately vacuum-laminated one on the other over the substrate in the above vacuum range. The mode of separate lamination is seen from FIG. 3. The insulating layer 11 is fed via rolls 31, 31 on to a laminating roll 30 and the copper foil 12 via rolls 32, 32 on to a similar laminating roll 30 over two opposite longitudinal sides of the circuit board 40 while in travel toward a direction indicated by the arrow. The layer 11 and the foil 12 are thus superposed one on the other over the board 40 upon contact with the rolls 30, 30 rotating with heat, after which a laminate 20 is provided as shown in FIG. 4.

In the practice of the method contemplated under the invention, the circuit board may conveniently be pretreated with any known suitable prime coat to further improve lamination.

The laminate 20 is thereafter cured in vacuo or atmospheric pressure at from 120° to 170° C. for from 1 to 4 hours. Vacuum curing may be accomplished at a vacuum degree of several to tens of torrs.

It should be noted that no strains are left on the laminate according to the invention due to high ambient temperature and pressure being not required.

The printed wiring board thus obtained may be provided on both sides with the circuit patterns with the copper foil etched in conventional manner.

Figure 6:
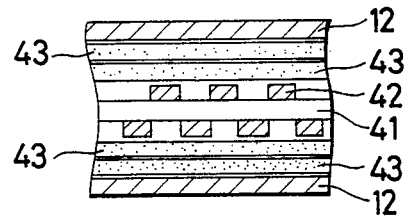

A multi-layered printed wiring board of the prior art is shown in FIG. 6. Designated at 43 are layers of a glass epoxy prepreg.

The invention will now be described by way of the following examples which are provided for purposes of illustration only. In these examples all parts are indicated by weight, all poises by P and all torrs by T unless otherwise noted.

EXAMPLE 1

A composition formulated below was dissolved in methyl ethyl ketone (MEK) to thereby prepare a solution of 45% in concentration. The solution was applied twice on to a copper foil (TC, Nikko-Gould Foil Co., 18-micron thickness) to a dry coat thickness of 200 microns, after which there was obtained a copper-clad insulating film according to the invention.

| component | part |
|---|---|
| epoxy resin | 100 |
| (bisphenol-epichlorohydrin type, | |
| epoxy equivalent 500) | |
| NBR | 40 |
| (nitrile content 33%, | |
| Mooney viscosity 51) | |
| calcium carbonate | 50 |
| imidazole compound | 8 |
| peroxide | 1 |
| additive | 0.5 |

The film was examined for viscosity of its insulating layer by dynamic mechanical analysis (DMA), the viscosities measured being found to be 5,000 P at 120° C., 35,000 P at 100° C. and 80,000 P at 80° C. Subsequently, the film was vacuum-laminated over a board having a comb-toothed circuitry of 0.5 mm in line spacing (electrolytic copper, 70-micron thickness). Lamination was effected at 100° C. and at 40 T with the insulating layer contacted with the board. A voidless laminate was found to have been fabricated on naked inspection of fluidity in between the circuits.

The resulting laminate was mounted on an aluminum curl plate which was then put into an autoclave adjusted at 5 T, followed by curing at 7 kg/cm$^2$ for one hour. The final product has proved acceptable with respect to thickness uniformity of the insulating layer, bondability of the copper foil and heat resistance on soldering at 260° C.

EXAMPLE 2

An MEK solution of 47% was prepared using a composition of the following formulation. The solution was treated as was in Example 1 to give a 200-micron thick, copper-clad film according to the invention.

| component | part |
|---|---|
| epoxy resin | 100 |
| (cresol-novolak type, | |
| epoxy equivalent 220) | |
| NBR | 30 |
| (nitrile content 41%, | |
| Mooney viscosity 63) | |
| alpha-type hemihydrate | 40 |
| imidazole compound | 10 |
| peroxide | 1 |
| additive | 0.5 |

DMA examination showed that the film had viscosities of 3,500 P at 120° C., 28,000 P at 100° C. and 60,000 P at 80° C.

The lamination procedure of Example 1 was followed except that the temperature and vacuum were changed to 80° C. and 20 T, respectively, and the resulting laminate was found voidless and acceptable. The laminate was thereafter cured, on a vacuum press adjusted at 50 T, at 150° C. and at 10 kg/cm² for one hour. The cured product has been confirmed uniform in thickness, sufficient in bondability and stable on soldering at 260° C.

EXAMPLE 3

A composite film shown in FIG. 1 was laminated over both sides of a circuit board of FIG. 5 on a vacuum laminator under conditions of vacuum degree 40 T, roll surface temperature 100° C., board travel speed 1.3 m/min and roll pressure 4 kg/cm², thereby providing a laminate of FIG. 4. In an autoclave adjusted at 5 T curing was done at 7 kg/cm² for one hour. The cured product was examined for thickness uniformity and voidlessness of the insulating layer and heat resistance on soldering under the conditions given below and with the results tabulated below.

Thickness Uniformity

Measurement was made by light-microscopic photography of the cured insulating layer at five cut-away portions. This quality was expressed by the magnitude of deviation from the targeted thickness.

Voidlessness

Naked inspection was followed. In the table "voidless" was designated by "o" and "void" by "x".

Heat Resistance on Soldering

The cured product was cut to 25×25 mm and allowed to float on soldering liquid at 260° C., followed by inspection of the appearance after lapse of 3 minutes. "o" was used to mean no blister nor peel and "x" blistered and peeled. By "-" was meant that no such test was made.

EXAMPLE 4

Figure 3:
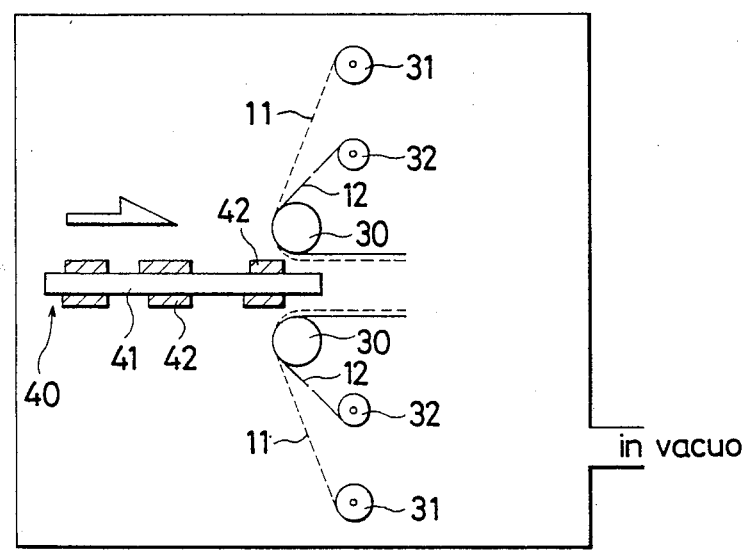
FIG. 3 is a diagramatic representation of a preferred embodiment of the vacuum lamination according to the invention.
Figure 4:
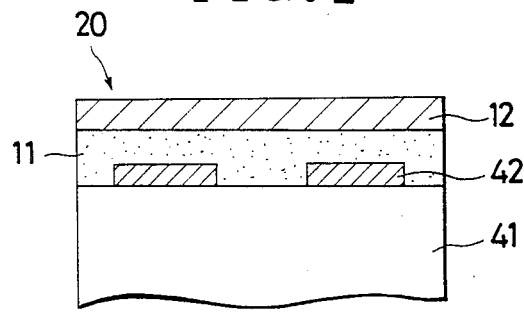
FIG. 4 is a view, seen in cross section and in segment, of the laminate according to the invention.

An insulating layer and a copper foil were separately vacuum-laminated at 20 T, as shown in FIG. 3, on to both sides of a circuit board of FIG. 5. The laminate was cured at 150° C. and at 7 kg/cm² for one hour with the use of an autoclave adjusted at 5 T. The resulting product was tested as was in Example 3.

EXAMPLE 5

The procedure of Example 3 was followed except that curing was effected at 150° C. and at 7 kg/cm² for one hour on a vacuum press adjusted at 30 T.

EXAMPLE 6

The procedure of Example 3 was followed except that an atmospheric hydraulic press was used to cure the resulting laminate at 150° C. and at 15 k/cm² for one hour.

EXAMPLE 7

The procedure of Example 3 was followed except that a vacuum press adjusted at 40 T was used for curing at 150° C. and at 10 k/cm² for one hour.

EXAMPLE 8

The procedure of Example 3 was followed except that the resulting laminate was preformed on a vacuum press adjusted at 20 T, followed by pressing at 150° C. and at 12 k/cm² for one hour.

COMPARATIVE EXAMPLE 1

On both sides of a circuit board of FIG. 5 were disposed two layers of a prepreg (epoxy content 42%, fibrous glass, 0.1-mm thickness) as seen from FIG. 6. The prepreg was one used commonly for mass lamination. A resinous copper foil (R 0860, 18-micron thickness) was then laminated over each of the prepreg-layered surfaces. The resulting laminate was pressed at 5 kg/cm² on a hydraulic press and then heated at 130° C. Five minutes afterwards the pressure was elevated to 40 kg/cm². Upon disposition as it was for one hour, the laminate was cooled at room temperature while the pressure was being maintained at 40 kg/cm².

The wiring board so formed was satisfactory in respect of all physical qualities tested. The control assembly, however, was extremely tedious and time-consuming and hence less producible.

COMPARATIVE EXAMPLE 2

The procedure of Comparative Example 2 was followed except that a vacuum laminator adjusted at 10 T was employed for lamination with a roll temperature of 100° C. and a roll pressure of 4 kg/cm². On a vacuum press adjusted at 30 T curing was carried out at 170° C. and at 10 kg/cm² for one hour.

The control product revealed irregular thickness and objectionable blister and peel on soldering.

TABLE

| Properties | Examples | | | | | | Comparative |
| | 3 | 4 | 5 | 6 | 7 | 8 | Example 2 |
| --- | --- | --- | --- | --- | --- | --- | --- |
| thickness of insulating layer (micron) | −3.0− +3.0 | −4.0− +4.0 | −5.0− +5.0 | −1.0− +5.0 | −2.0− +2.0 | −1.0− +3.0 | −20− +40 |
| voidlessness of insulating layer | o | o | o | o | o | o | x |
| heat resistance on soldering | o | o | o | o | o | o | — |

What is claimed is:

1. A composite film for use in printed wiring boards which comprises an insulating layer and a copper foil laminated thereon in direct contact with said insulating layer, the insulating layer comprising a blend of an epoxy resin and an acrylonitrile-butadiene rubber, the weight ratio of epoxy resin to acrylonitrile-butadiene rubber being in the range of from 30:70 to 90:10.

2. The film of claim 1, the insulating layer being uncured.

3. The film of claim 1, further including a cured resinous layer interposed between the insulating layer and the copper foil.

4. The film of claim 3, further including a bonding layer disposed over the insulating layer on one side opposed to the copper foil when cured.

5. The film of claim 2, the uncured insulating layer having a viscosity of from $10^3$ to $10^5$ poises at a maximum temperature at the time of lamination.

6. The film of claim 3, the resinous layer being formed of a mixture of an epoxy resin and an acrylonitrile-butadiene rubber, an epoxy resin, an acrylic resin or a polyimide resin.

7. The film of claim 4, the bonding layer having a viscosity of from $10^3$ to $10^5$ poises at a maximum temperature at the time of lamination.

8. A printed wiring board comprising a substrate and a composite film disposed integrally thereover, the composite film comprising an insulating layer and a copper foil laminated thereon in direct contact with said insulating layer, the insulating layer comprising a blend of an epoxy resin and an acrylonitrile-butadiene rubber, the weight ratio of epoxy resin to acrylonitrile-butadiene rubber being in the range of from 30:70 to 90:10.

9. A method of producing a printed wiring board which comprises vacuum-laminating a composite film over a substrate, the composite film comprising an insulating layer and a copper foil laminated thereon in direct contact with said insulating layer, the insulating layer comprising a blend of an epoxy resin and an acrylonitrile-butadiene rubber, the weight ratio of epoxy resin to acrylonitrile-butadiene rubber being in the range of from 30:70 to 90:10 and subsequently curing the resulting laminate with heat.

10. The method of claim 9, the insulating layer and the copper foil being separately vacuum-laminated one on the other over the substrate.

11. The method of claim 9, the curing being effected in vacuo or at atmospheric pressure.

* * * * *